(12) United States Patent
Boutorabi et al.

(10) Patent No.: US 8,144,446 B2
(45) Date of Patent: Mar. 27, 2012

(54) ISOLATED CURRENT SENSOR

(75) Inventors: Kourosh Boutorabi, Tustin, CA (US); Bert White, Irvine, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 811 days.

(21) Appl. No.: 12/178,547

(22) Filed: Jul. 23, 2008

(65) Prior Publication Data

US 2010/0023283 A1    Jan. 28, 2010

(51) Int. Cl.
*H02H 7/00* (2006.01)
(52) U.S. Cl. ........................................ 361/115
(58) Field of Classification Search ................ 361/110, 361/115
See application file for complete search history.

(56) References Cited

FOREIGN PATENT DOCUMENTS

| | | |
|---|---|---|
| GB | A-2 431 475 | 4/2007 |
| JP | 55110428 | 8/1980 |
| WO | WO00/00834 | 1/2000 |

OTHER PUBLICATIONS

International Preliminary Report on Patentability and Written Opinion of the International Searching Authority for Int. App. No. PCT/US2009/049279, dated Feb. 3, 2011.

*Primary Examiner* — Stephen W Jackson

(57) ABSTRACT

The present disclosure includes a power measurement, circuit breaker or integrated protection system including isolated analog-to-digital modulators for measuring current using current sensors, such as, for example, current shunts, in a single or multiphase power system. In one embodiment, the modulators are divided into a line-side device with an analog-to-digital modulator and a host-side device including a decimation filter and a processor. In one embodiment, an isolation barrier, such as, for example, a pulse transformer, divides the line-side device from the host-side device.

37 Claims, 10 Drawing Sheets

ISOLATED CURRENT SENSOR

FIELD OF THE INVENTION

The present invention relates to the field of electrical power measurement.

BACKGROUND

Electricity is a primary power source used in residential and commercial applications. Measuring the amount of electricity consumed is an important task in determining how much to charge a user. In addition, historic trends of electrical consumption are an important tool in determining how much electricity needs to be produced at any given time.

Electricity is generally delivered over power lines as alternating current. Electricity can be supplied as single-phase, double-phase, or triple-phase. Each additional phase generally necessitates using an additional power line. Additional phases can also be supplied with additional lines.

Electricity is generally measured in terms of an amount of total power consumed. Total power consumption generally involves the integration of power used over a specified period of time. Power is the product of voltage (V) and current (I). Electricity meters generally measure total power consumed by measuring the product of the voltage and the current at a given instant in time and accumulating (e.g. integrating) the product over time.

One way to measure the current is by using a current transformer. A current transformer generally includes a series of coil loops that encircle a toroidal core. When loaded with a burden resistor, the coil loop produces a voltage proportional to the current running through the power line. Current transformers are generally preferred for industrial and commercial poly-phase metering due to the current transformer's inherent DC isolation from phase to phase.

A second way to measure current is by using a Rogowski coil. A Rogowski coil generally includes a toroidal coil placed around a conductor whose current is to be measured. A voltage is induced in the coil which is proportional to the rate of change of the current in the conductor. The output of the Rogowski coil is generally connected to an electrical integrator circuit in order to provide an output signal that is proportional to the current. Rogowski coils are generally less expensive than current transformers.

Another way to measure the current is by using a current shunt. A current shunt generally includes a relatively small resistor which is placed in series with the power line. The current flows through the current shunt creating a small voltage across the shunt. A voltage meter then measures the voltage drop to determine the amount of current flowing through the current shunt. Current shunts by themselves are not isolated from the power line and are therefore not preferred for multiphase power measurement as phase-phase difference voltages produced on the input pins of power metering device can easily exceed maximum levels allowed in standard semiconductor products. Current shunts are generally less expensive than current transformers and Rogowski coils, however, due to the isolation issues, current transformers are preferred for commercial applications.

SUMMARY

Aspects of the present disclosure include a current sensor and a digital barrier for providing electrical isolation. The isolation allows a shunt current sensor to be used in a multiphase power system to determine an accurate measure of current flow. It also lessens the impact of magnetic interference generally introduced as means of energy theft or tampering. The digital isolation also reduces effects of cross-coupling interference and improves Electromagnetic Compatibility (EMC) and Electrical Fast Transient (EFT) immunity. The digital barrier isolation also improves the analog-to-digital conversion's (ADC) effective signal to noise ratio (SNR) by electrically isolating the front end from host-side noise sources. The isolation barrier provides phase-to-phase isolation between power line phases or phases-to-Neutral. This allows the current sensor to be used to measure multi-phase power or current or single-phase power or current with neutral current measurement in a cost effective system. Additionally, in many cases, using digital barrier isolation reduces the overall size of the meter or current protection device (Circuit Breaker).

In one embodiment, a current sensor is used to measure current in a power line. In one embodiment, the current sensor is a current shunt, a current transformer, a Rogowski coil, or other device for measuring current. The current sensor is in communication with an analog-to-digital converter. The analog-to-digital converter is in communication with a barrier interface. The barrier interface is in communication with a barrier isolation module. The barrier isolation module includes, for example, a relatively high-frequency transformer (such as, for example, a pulse transformer) or a capacitor. The barrier isolation module is in communication with a second barrier interface module. The second barrier interface module is in communication with a signal processing circuit. The signal processing circuit determines an indication of current and power usage and sends the indication to a display device or a second processor for further analysis.

In one embodiment, a SIGMA-DELTA converter is used to convert a differential analog signal produced by a current sensor to digital data representing current flowing through the sensor according to Ohm's law. In one embodiment, the SIGMA-DELTA converter is divided into two circuits which are at least partially electrically isolated from one another with a transformer (including, such as, for example, a pulse transformer) or a capacitor. The transformer provides unidirectional and/or bidirectional digital data transfer as well as power transfer between the two parts of the SIGMA-DELTA converter.

In one embodiment, the first circuit, or line-side circuit, includes a SIGMA-DELTA modulator, a voltage reference module, and a barrier interface module. The line-side circuit manages transmissions of data and reception of power to and from the isolation barrier. In one embodiment, the line-side circuit is implemented in a semiconductor device. In one embodiment, the line-side circuit includes such as, for example, a entire SIGMA-DELTA converter (e.g. modulator and FIR filter) or other type of analog to digital converter. In one embodiment, the SIGMA-DELTA modulator or other analog to digital converter is located on the line-side circuit.

In one embodiment, the host-side circuit includes the second half of the SIGMA-DELTA converter which is often referred to as the FIR filter or decimation filter, and a barrier interface module. The host-side device manages transmission of data and power to and from the isolation barrier. In one embodiment, the host-side device is implemented in a semiconductor device. In one embodiment, the host-side device includes other functions useful in performing functions common in electricity metering or circuit breaker/protection applications, such as, for example, voltage sensing, RMS current measurement, power usage computation, power usage display, or the like. Although described with respect to a SIGMA-DELTA converter, a person of skill in the art will understand from the disclosure herein that other converters can also be used with the present disclosure.

In one embodiment, the isolation barrier is formed on an integrated circuit. In one embodiment, the isolation barrier includes a high-frequency transformer. In one embodiment, the isolation barrier is on the same chip as either or both of the line-side device and the host-side device. In one embodiment, the isolation barrier is located in a separate housing from either or both of the line and host-side devices.

In one embodiment, power is transmitted from the host side device to the line side device through the isolation barrier. In one embodiment, measurement information and/or other communications are sent from the line side device to the host side device through the isolation barrier. In one embodiment, command data and/or other communications are transmitted from the host side device to the line side device through the isolation barrier.

DETAILED DESCRIPTION

Figure 1:
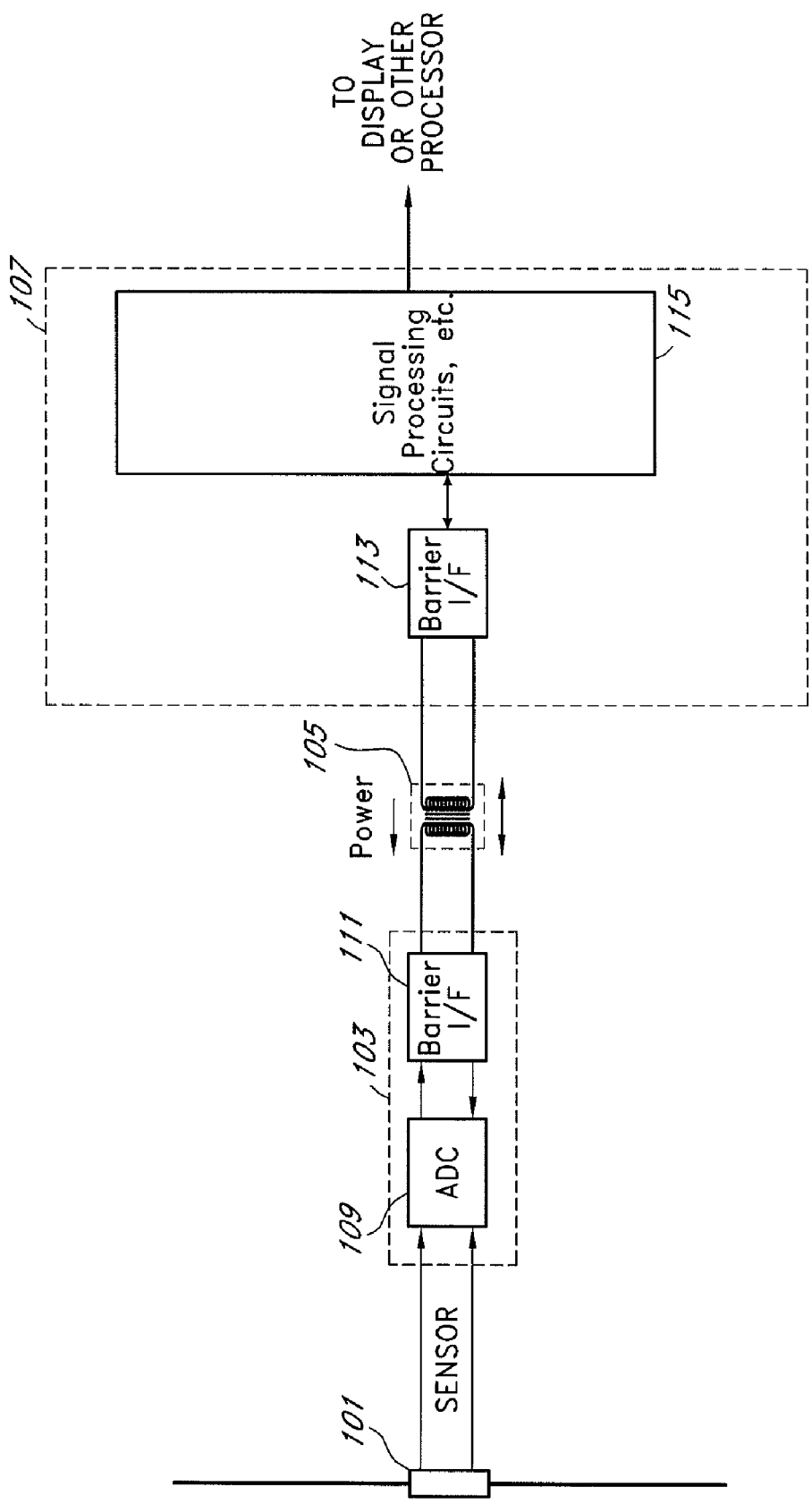
FIG. 1 illustrates an embodiment of a current measurement device.

FIG. 1 illustrates an embodiment of a current sensor measurement system. A sensor 101, such as, for example, a current shunt, a Rogowski coil, a current transformer, or the like, senses the current running through a power line. The sensor 101 is in communication with a line-side device 103. The line-side device 103 is in communication with an isolation barrier 105 which is in communication with a host-side device 107. Although referred to as a line-side device and host-side device, the names are a designation only and are not meant to limit the location of the device. In addition, descriptive words, such as, for example, device, module, etc. used herein are meant only to describe certain sections of an overall system and are not meant to limit sections of the system to be included in the same, or separate housings or on the same or separate chips. As one of ordinary skill in the art will understand from the present disclosure, various sections of the system can be incorporated into the same or separate housings, boards and/or chips.

The line-side device 103 includes an analog-to-digital converter 109 and a barrier interface 111. The analog-to-digital converter 109, converts the analog measurement of current across the current sensor to a digital value. The digital value is then communicated to the barrier interface which transmits the digital information across the isolation barrier 105 to the host-side device 107.

The isolation barrier 105 includes a high-frequency transformer, such as a pulse transformer which electrically isolates the host-side device from the line-side device. In one embodiment, a capacitor is used to provide isolation in addition to the high-frequency transformer or instead of the high-frequency transformer. The host-side device 107 includes a barrier interface 113 and a signal processing circuit 115. The barrier interface 113 transmits power to the line-side device 103 and receives data from the line-side device 103. In one embodiment, the barrier interface 113 transmits data to the line-side device, and the barrier interface 111 receives the data. The barrier interface 113 is in communication with the signal processing circuit 115. The signal processing circuit 115 determines an indication of power usage and communicates the indication for further use, such as, for example, for display by a display device or for communication to a power supplier.

The isolation barrier 105 provides DC and low-frequency isolation between the line-side device 103 and the host-side device 107. This is desirable for multiphase power measurement. In one embodiment, the data rate is relatively low to reduce power consumption and to reduce the size of the isolation barrier 105. In one embodiment, power is supplied to the line-side device 103 from the host-side device 107 through the isolation barrier. In one embodiment, the power supplied is less than 50 mW. In one embodiment, the power supplied is less than 5 mW. In one embodiment, data is sent from the line-side device 103 to the host-side device 107 through the isolation barrier 105. In one embodiment, data is sent from the host-side device 107 to the line-side device 103 through the isolation barrier 105. In one embodiment, data is sent bidirectionally through the isolation barrier 105 to and from the host and line-side devices 103, 107.

Still referring to FIG. 1, in operation, current flows through the power line and sensor 101. A voltage representative of the current is generated by the sensor 101 and is transmitted to the ADC 109 on the line-side device 103. The ADC 109 can be, such as, for example, a SIGMA-DELTA modulator (ASDM). The ADC 109 converts the voltage to a digital value and communicates the digital value to the barrier interface 111. The barrier interface 111 modulates or otherwise communicates the digital value across the isolation barrier 105. Communication across the barrier can be in the form of an intermediate or high-frequency. Using a high-frequency transformer as the isolation barrier has the added benefit of reducing the size of the transformer needed. The barrier interface 113 demodulates or receives the digital value that was sent across the isolation barrier 105 and communicates the digital value to the signal processor 115 for processing. The signal processor 115 filters, analyzes, processes, and/or determines a power consumption measurement using the digital value and outputs the measurement. In addition, the barrier interface 113 transmits power across the isolation barrier from the host-side device to the line-side device to power the line-side device. In one embodiment, power is transmitted through the isolation barrier 111 as a sinusoidal or pulse signal at a frequency that is high relative to the frequency of the power line. In one embodiment, power is transmitted through the isolation barrier 111 as part of a clock signal which is supplied to the analog-to-digital converter. A voltage converter device included on the line-side device transforms a portion of the clock signal to a desired DC voltage by, such as, for example, rectifying and filtering the clock pulse signal.

The DC voltage is then supplied to the various components of the line-side device. In one embodiment, data is transmitted across the isolation barrier from the line-side device to the host-side device in order to provide, such as, for example, clock information, configuration data, command data, or the like. The clock signal and the data can be passed back and forth across the isolation barrier at the same frequency or at different frequencies.

Figure 2:
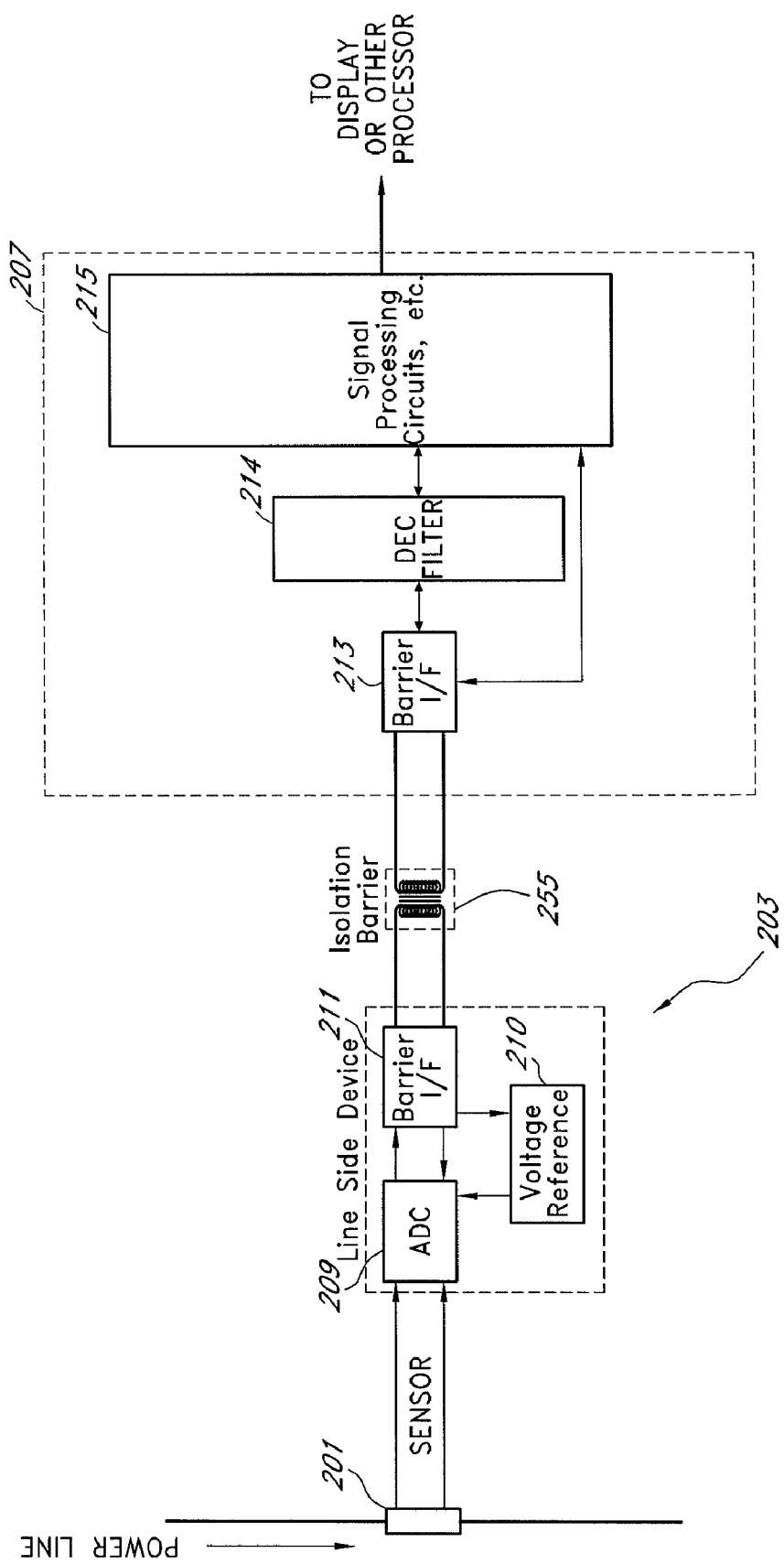
FIG. 2 illustrates another embodiment of a current measurement device.

FIG. 2 illustrates an embodiment of a current sensor measurement device with a transformer, such as a high-frequency pulse transformer. Current flowing through a power line is measured using a current sensor 201. The measurement device includes a line-side device 203, an isolation barrier 205, and a host-side device 207. The line-side device 203 includes an analog to digital converter 209, a barrier interface 211 and a voltage reference 210. The ADC 209 converts an analog input representative of the current flowing in the power line into a digital value and communicates the digital value to the barrier interface 211. The barrier interface 211 communicates with the line-side device 207 through the isolation barrier 205. Communication through the barrier 205 can be one-way or two-way communication. In one embodiment, the ADC consists of a SIGMA-DELTA Modulator. In one embodiment, power is received by the barrier interface 203 through the isolation barrier. A voltage reference 210 communicates received AC power from the barrier interface 205 and converts the AC power to DC power at a desired voltage. The DC power is provided to the line-side device, including the ADC 209. The barrier interface 211 is in communication with the ADC 209 for receiving digitized current information and optionally transmits sampling, clock or other information to the ADC 209.

The host-side device 207 includes a barrier interface 213, a decimation filter 214, and a signal processing circuit 215. The barrier interface 213 allows for communication between the host-side device 207 and the line-side device 203 through the isolation barrier 205, similar to the isolation barrier 211 in the line-side device 203. The barrier interface 213 communicates information received from the line-side device to the decimation filter 214. The decimation filter 214 is a digital filter which filters the digital signal received from the line-side device 203. The decimation filter 214 then communicates a filtered digital signal indicative of the voltage across the shunt 201 to the signal processing circuit 215. The signal processing circuit analyzes the filtered digital signal and outputs an indication of current or power running through the power line.

Still referring to FIG. 2, in operation current flows through the power line and sensor 201. A voltage proportional to the current is generated by the sensor 201 and is transmitted to the ADC 209 on the line-side device 203. The ADC 209 converts the voltage to digital values and communicates the digital values to the barrier interface 211. The barrier interface 211 modulates or otherwise communicates the digital value across the isolation barrier 205. The barrier interface 213 demodulates or receives the digital values sent across the isolation barrier 211 and communicates the digital value to the decimation filter 214 for processing. The decimation filter 214 then sends the filtered digital values to the signal processor for further processing. The signal processor 215 filters, analyzes, processes, and/or determines a power consumption measurement using the digital values and outputs the measurement. In one embodiment, the barrier interface 213 transmits power across the isolation barrier 205 from the host-side device 207 to the line-side device 203 to power the line-side device 203. In one embodiment, power is a relatively high-frequency sinusoidal or pulse power signal. In one embodiment, power is transmitted through the isolation barrier 111 as part of a clock signal which is supplied to the analog-to-digital converter. A voltage converter device included on the line-side device transforms a portion of the clock signal to a desired DC voltage by, such as, for example, rectifying and filtering the clock pulse signal. The DC voltage is then supplied to the various components of the line-side device. The voltage reference device 210 included on the line-side device 203 transforms the power signal to a desired DC voltage. The DC voltage is then supplied to the various components of the line-side device 203 for power. In one embodiment, data is transmitted across the isolation barrier from the host-side device to the line-side device in order to provide, such as, for example, clock information, configuration data, command data, or the like.

Figure 3A:
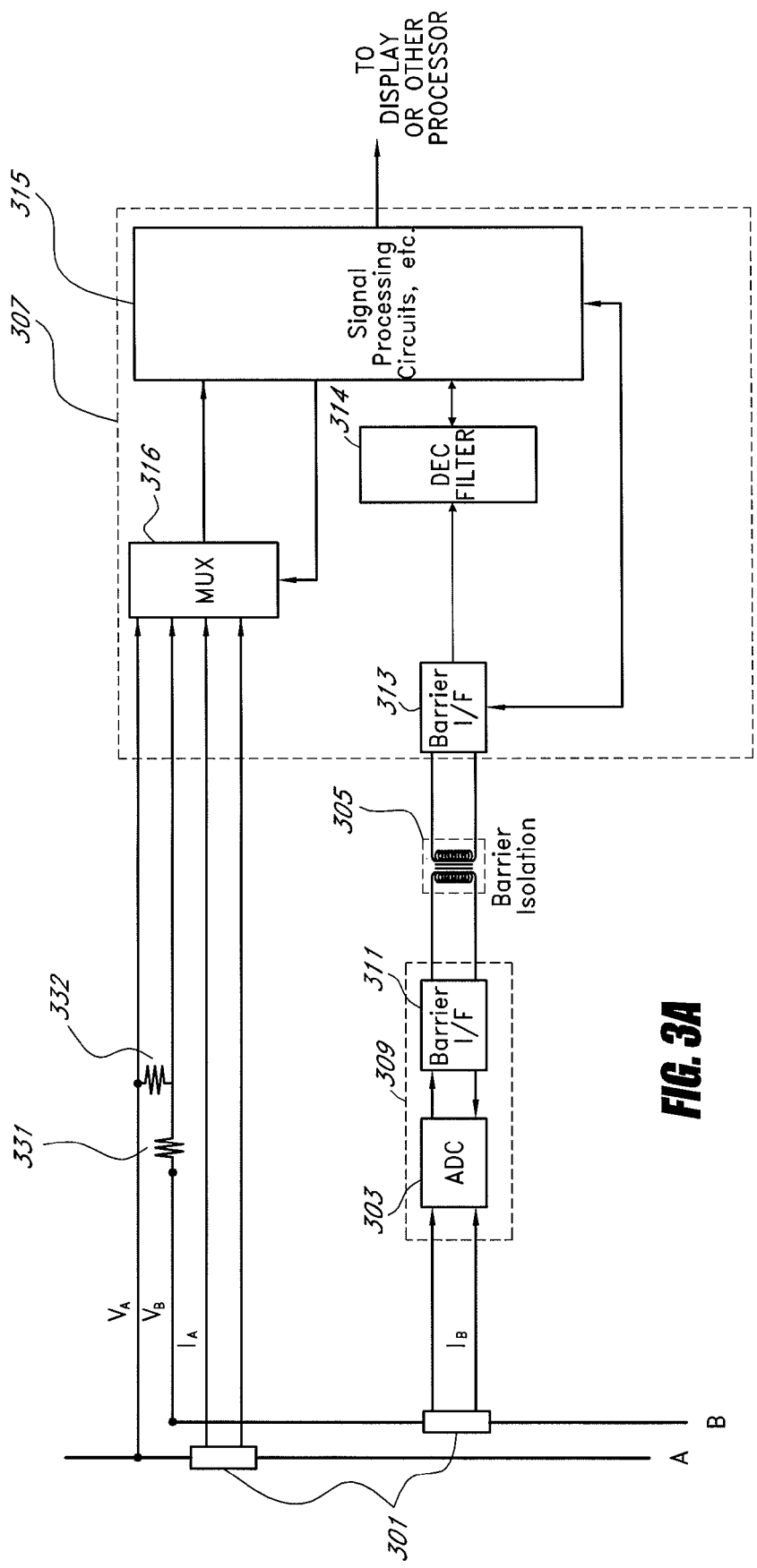
FIG. 3A illustrates an embodiment of a current measurement device with a transformer for use in a one or two phase meter or circuit breaker or integrated protection device.

FIG. 3A illustrates an embodiment of a current sensor measurement device with an internal transformer for use in a single-phase-plus-neutral or two-phase meter. FIG. 3A includes two current sensors 301; a line-side device 303, including an ADC 309 and a barrier interface 311; an isolation barrier 305; and a host side device 307 including a barrier interface 313, a multiplexer 316, a decimation filter 314, and a signal processor 315. The ADC 309, the barrier interfaces 311, 313, the isolation barrier 305, and the decimation filter 314 operate similar to those described with respect to FIG. 2. In addition to these components, a second current sensor 301 and voltage measurement lines are provided to the host-side device 307. Multiplexer 316 multiplexes the various current and voltage inputs to the signal processing circuit 315. This configuration allows for a less expensive measurement device which is capable of measuring both single and multiphase power by using few chip components. Also optionally included is an attenuation network including resistors 331 and 332. In an embodiment in which two-phase power is metered, a third neutral line can also be included with attenuation networks from each phase to the neutral line. In one embodiment, the ADC consists of a SIGMA-DELTA Modulator.

Still referring to FIG. 3A, in operation current flows through the power lines and sensors 301. A voltage proportional to the current running through each line is generated by the sensors 301 respectively and is transmitted to the ADC 309 on the line-side device 303. The ADC 309 converts the voltage to a digital value and communicates the digital value to the barrier interface 311. The barrier interface 311 modulates or otherwise communicates the digital value across the isolation barrier 305. The barrier interface 313 demodulates or receives the digital value that was sent across the isolation barrier 305 and communicates the digital value to the decimation filter 314 for processing. The decimation filter 314 then sends the filtered digital value to the signal processor for further processing. The signal processor 315 filters, analyzes, processes, and/or determines a power consumption measurement using the digital value and outputs the measurement. In one embodiment, the barrier interface 313 transmits power across the isolation barrier 305 from the host-side device 307 to the line-side device 303 to power the line-side device 303. In one embodiment, power is transmitted in the form of a sinusoidal or pulse power signal or a clock signal. The voltage reference device included on the line-side device 303 transforms the power signal to a desired DC voltage. The DC voltage is then supplied to the various components of the line-side device 303 for power. In one embodiment, data is transmitted across the isolation barrier from the host-side device to the line-side device in order to provide, such as, for example, clock information, configuration data, command data, or the like.

In addition, the voltage levels of each power line and additional current values for one or more of the power lines is sent to multiplexer 316. Multiplexer 316 multiplexes each of the voltage and additional current signals and transmits them one or a few at a time to the processor 315 for processing.

Figure 3B:
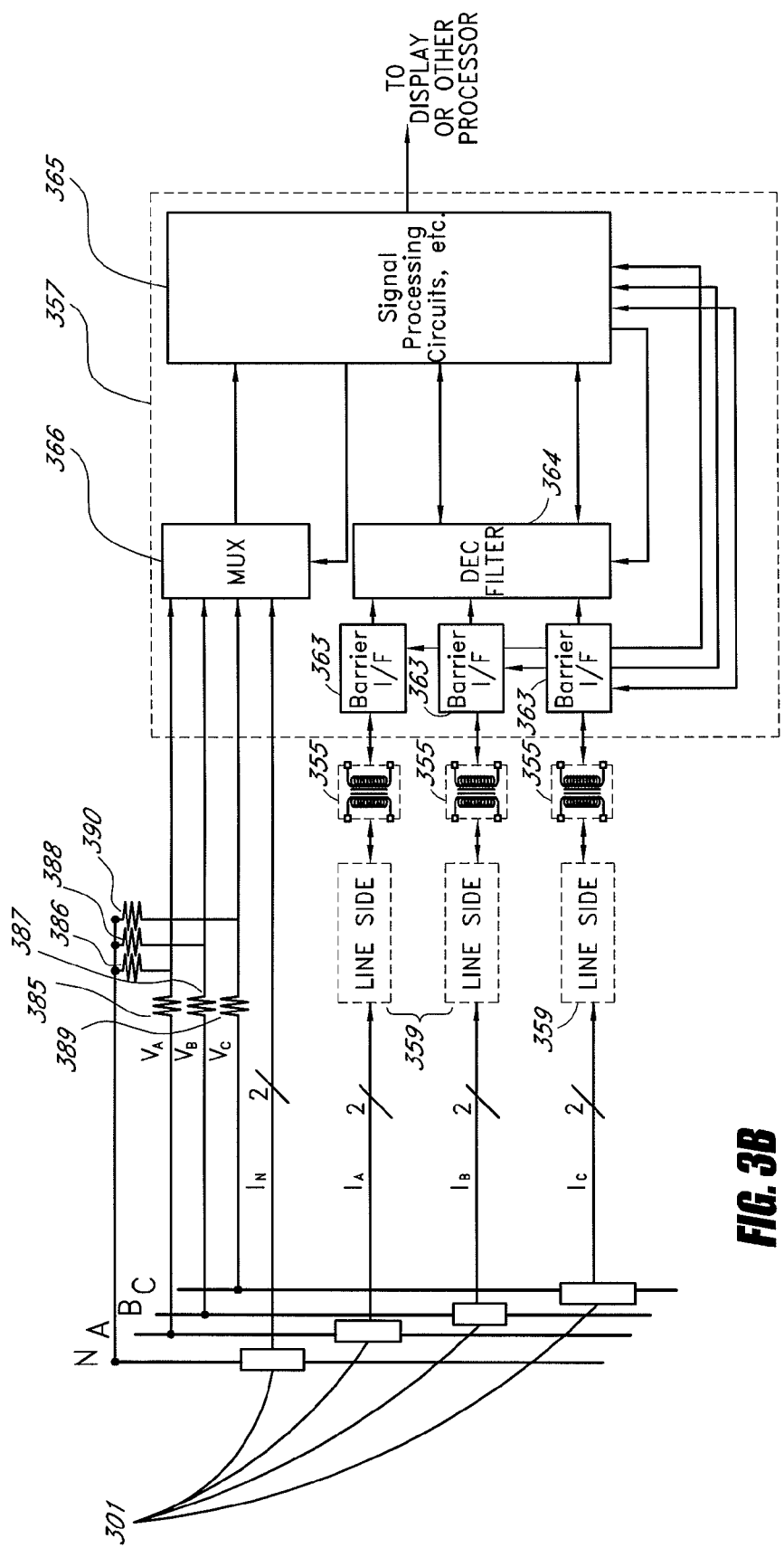
FIG. 3B illustrates an embodiment of a current measurement device with a transformer for use in a three phase meter or circuit breaker or integrated protection device.

FIG. 3B illustrates an embodiment which includes three separate isolated converters for measuring multiphase power. A person of skill in the art will understand from the disclosure herein that one, two, three, four, or more isolated converters can be used based on the number of phases of power to be measured. In addition, although the neutral line is shown without a digital isolation barrier, a person of skill in the art would understand from the disclosure herein that digital isolation could also be used with respect to measuring neutral current. The embodiment of FIG. 3B includes three isolated converters each including a line-side device 359, an isolation barrier 355, and barrier interfaces 363. In the embodiment of FIG. 3B, a decimation filter 314 is included with the host-side device 357. Optionally, in one embodiment, a multiplexer can be used to multiplexe the signals from the three barrier interfaces 363 through the decimation filter such that only one of the three signals is passed to the decimation filter at a time. In one embodiment, separate decimation filters are provided for each converter and all three signals are passed into the signal processing circuit 365. In addition to measuring the current from each phase, voltage from each phase, optionally including the neutral voltage as well as optionally the current through the neutral line are also measured in order to calculate an accurate power consumption. In an embodiment, attenuation networks can be optionally included between each phase and the neutral line. FIG. 3B illustrates an embodiment with attenuation networks including resistors 385, 386, 387, 388, 389 and 390.

Still referring to FIG. 3B, in operation current flows through the power lines and sensors 301. A voltage proportional to the current running through each line is generated by the sensors 301 respectively and is transmitted to the line-side devices 359. The ADCs convert the voltage to a digital value and communicate the digital value to the barrier interface. The barrier interface modulates digital values onto one or more carrier frequencies or otherwise communicates the digital value across the isolation barrier 355. The barrier interface 363 demodulates or receives the digital value that was sent across the isolation barrier 355 and communicates the digital value to the decimation filter 364 for processing. The decimation filter 364 then sends the filtered digital value to the signal processor 365 for further processing. The signal processor 365 filters, analyzes, processes, and/or determines a power consumption measurement using the digital value and outputs the measurement. In one embodiment, the barrier interface 363 transmits power across the isolation barrier 355 from the host-side device 357 to the line-side device 359 to power the line-side device 359. In one embodiment, power is transmitted in the form of a power signal or clock signal. A voltage reference device included on the line-side device 359 transforms the clock pulses to a desired DC voltage. The DC voltage is then supplied to the various components of the line-side device 359 for power. In one embodiment, data is transmitted across the isolation barrier 355 from the host-side device 359 to the line-side device 357 in order to provide, such as, for example, clock information, configuration data, command data, or the like.

In addition, the voltage levels of each power line and additional current values for one or more of the power lines is sent to multiplexer 366. Multiplexer 366 multiplexes each of the voltages and additional current signals and transmits them one or a few at a time to the processor 365 for processing. In one embodiment, multiplexer 366 is an analog multiplexer and the multiplexed values are converted from analog-to-digital values after they are multiplexed. In one embodiment, multiplexer 366 is a digital device and the multiplexed values are converted from analog-to-digital values before they are multiplexed.

Figure 3C:
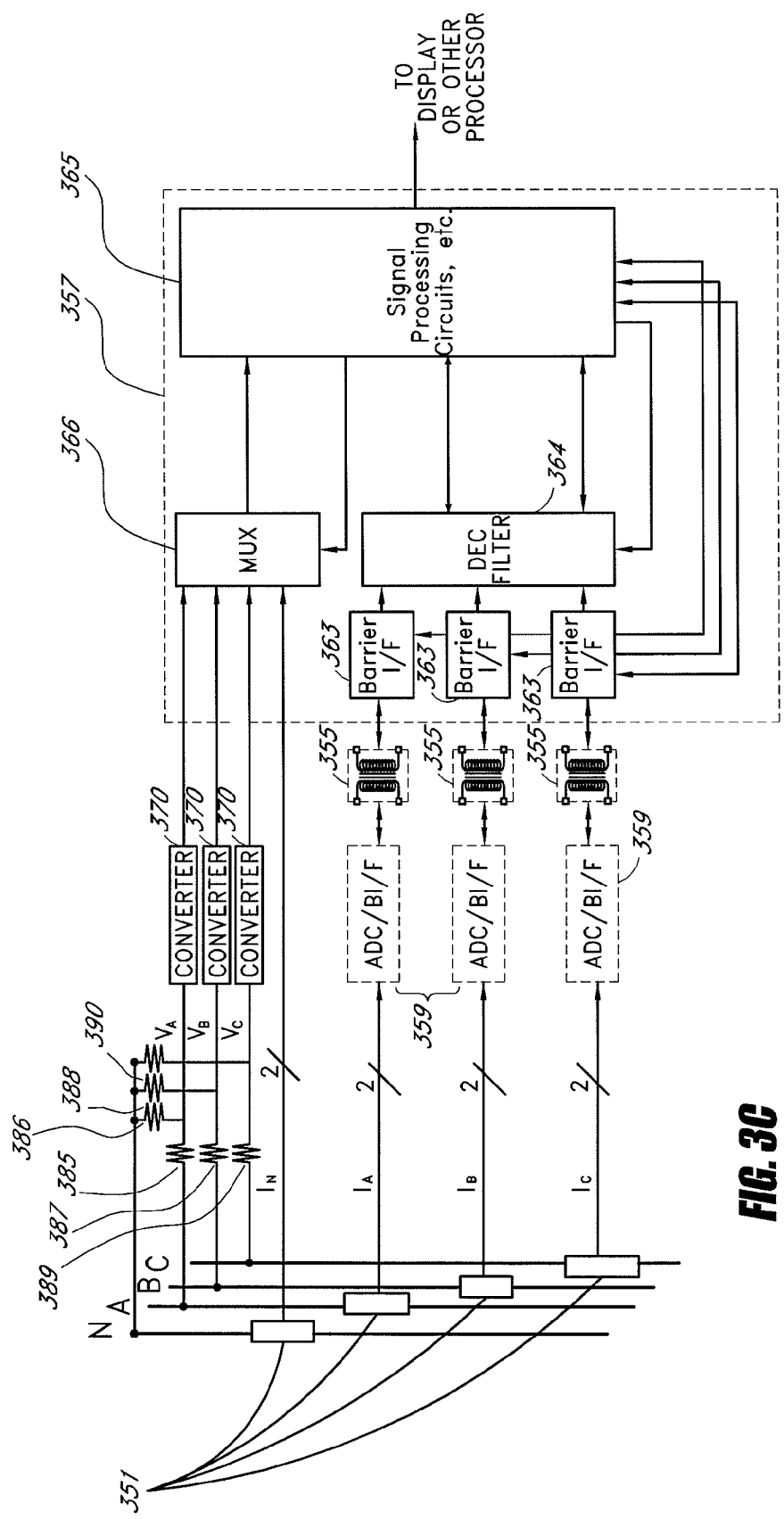
FIG. 3C illustrates another embodiment of a current measurement device with a transformer for use in a three phase meter.

FIG. 3C illustrates an embodiment of a power measurement device with a digital multiplexer. The operation and components are similar to FIG. 3B, with the exception that converters 370 are used in order to convert the analog voltages measured across the power line to a digital value. The digital values are then multiplexed and sent to the signal processor 365 for processing. In one embodiment, the current sensors transmit current information to an analog multiplexer which multiplexes the current information for conversion by one or more line side devices before being transmitted through the isolation barrier. In one embodiment, the converters are in the host side device.

Figure 4A:
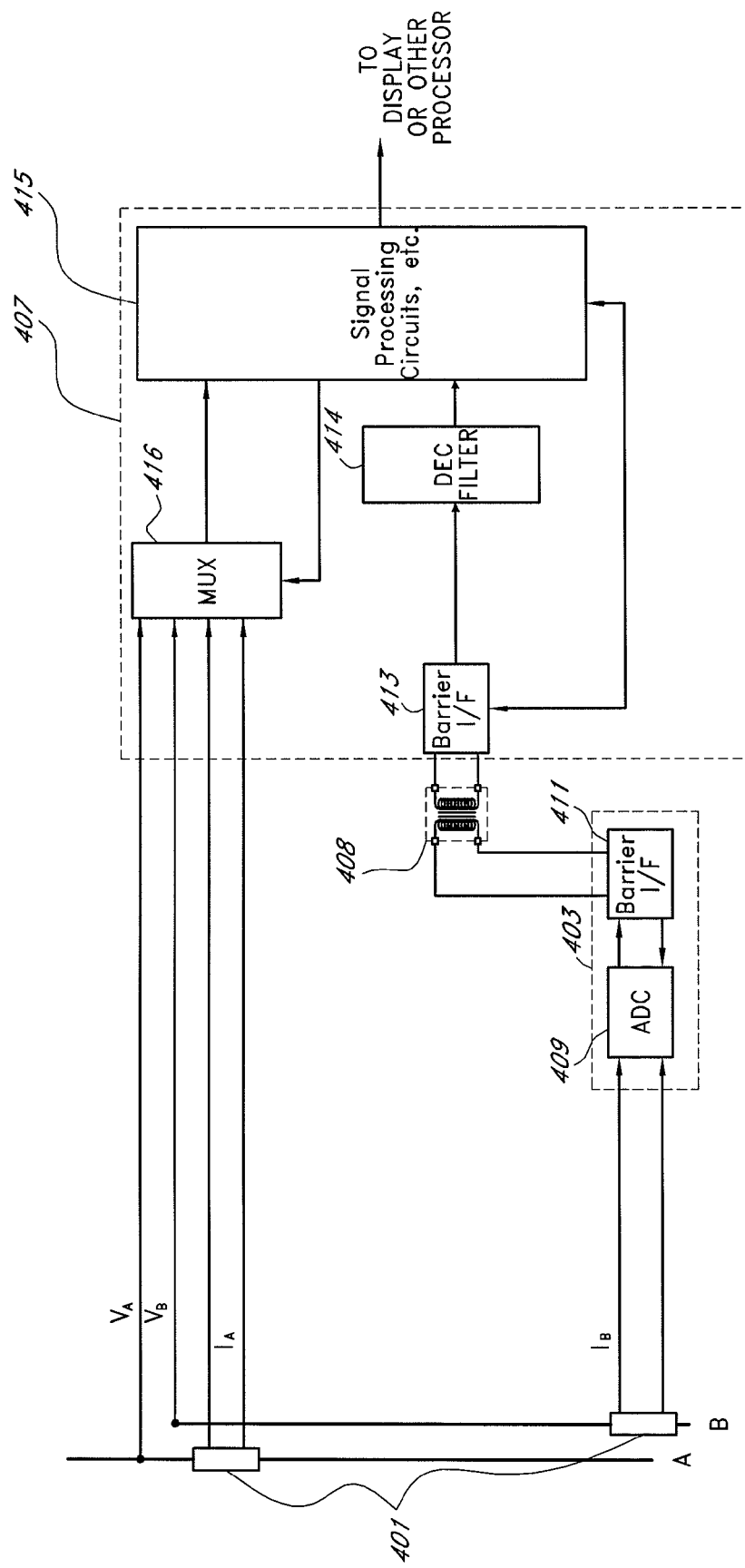
FIG. 4A illustrates an embodiment of a current measurement device with an external transformer for use in a one or two phase meter.
Figure 4B:
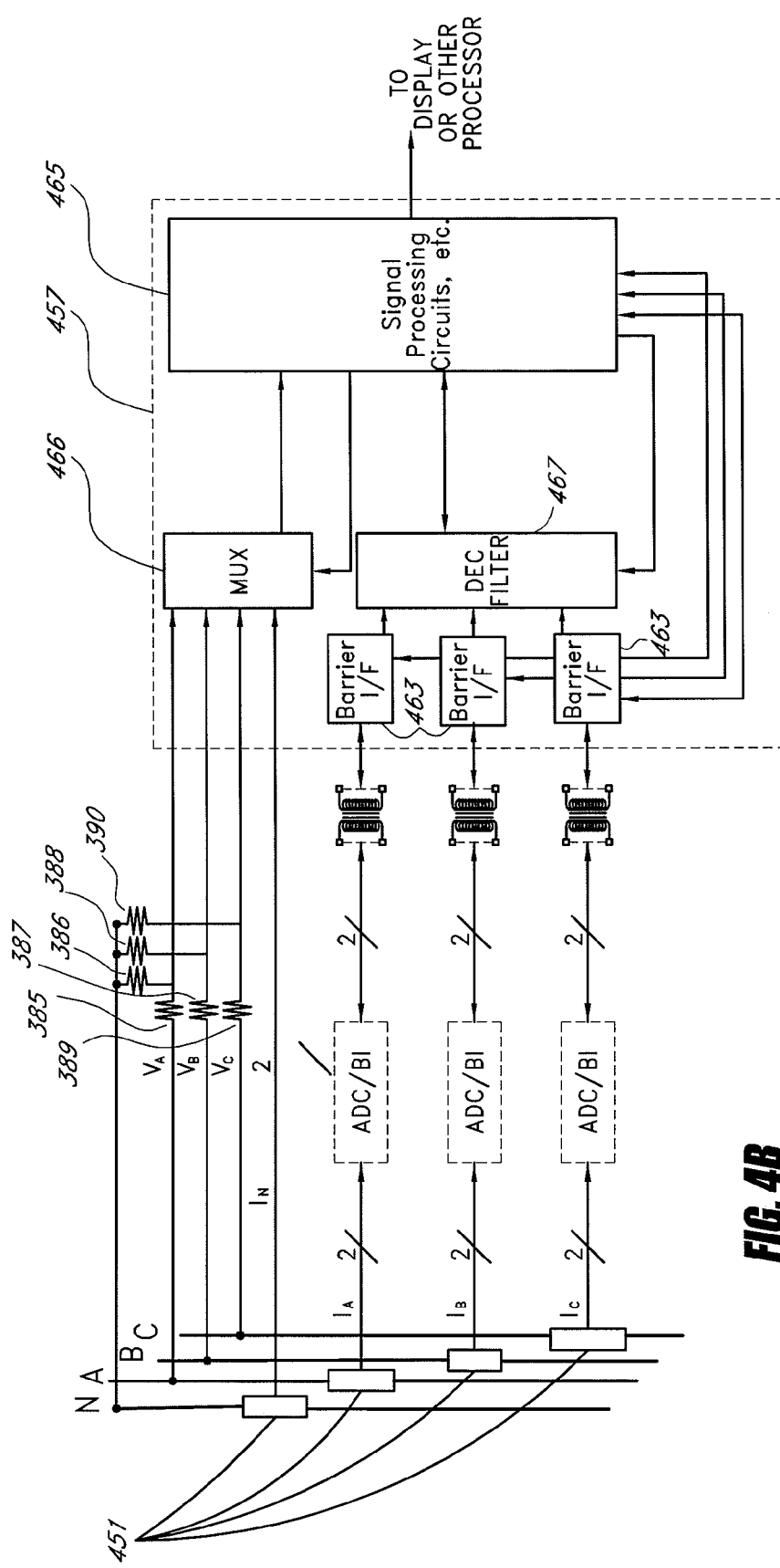
FIG. 4B illustrates an embodiment of a current measurement device with an external transformer for use in a three phase meter.

FIG. 4A illustrates an embodiment similar to FIG. 3A, with the exception that the isolation barrier 408 is located external to the line and host-side devices 403, 407. That is, the isolation barrier is not located on the same chip with the line-side device 403 and the host-side device 407. Although not illustrated, attenuation networks can also be used with this embodiment as described in FIG. 3A. FIG. 4B illustrates an embodiment similar to FIG. 3B, except that, as discussed above, the isolation barriers 455 are located external to the line-side and host-side devices 459, 457.

In one embodiment, the line side device is remote to the host side device. In one embodiment, the line side device is housed separately from the host side device. In one embodiment, the line side device is located on a separate chip and/or board than the host side device. In one embodiment, the isolation barrier is located on the same chip and/or board and/or housing as the line side device. In one embodiment, the isolation barrier is located on the same chip and/or board and/or housing as the host side device. Additionally, other combinations of locations of the line side device, host side device and isolation barrier are also possible.

Figure 5:
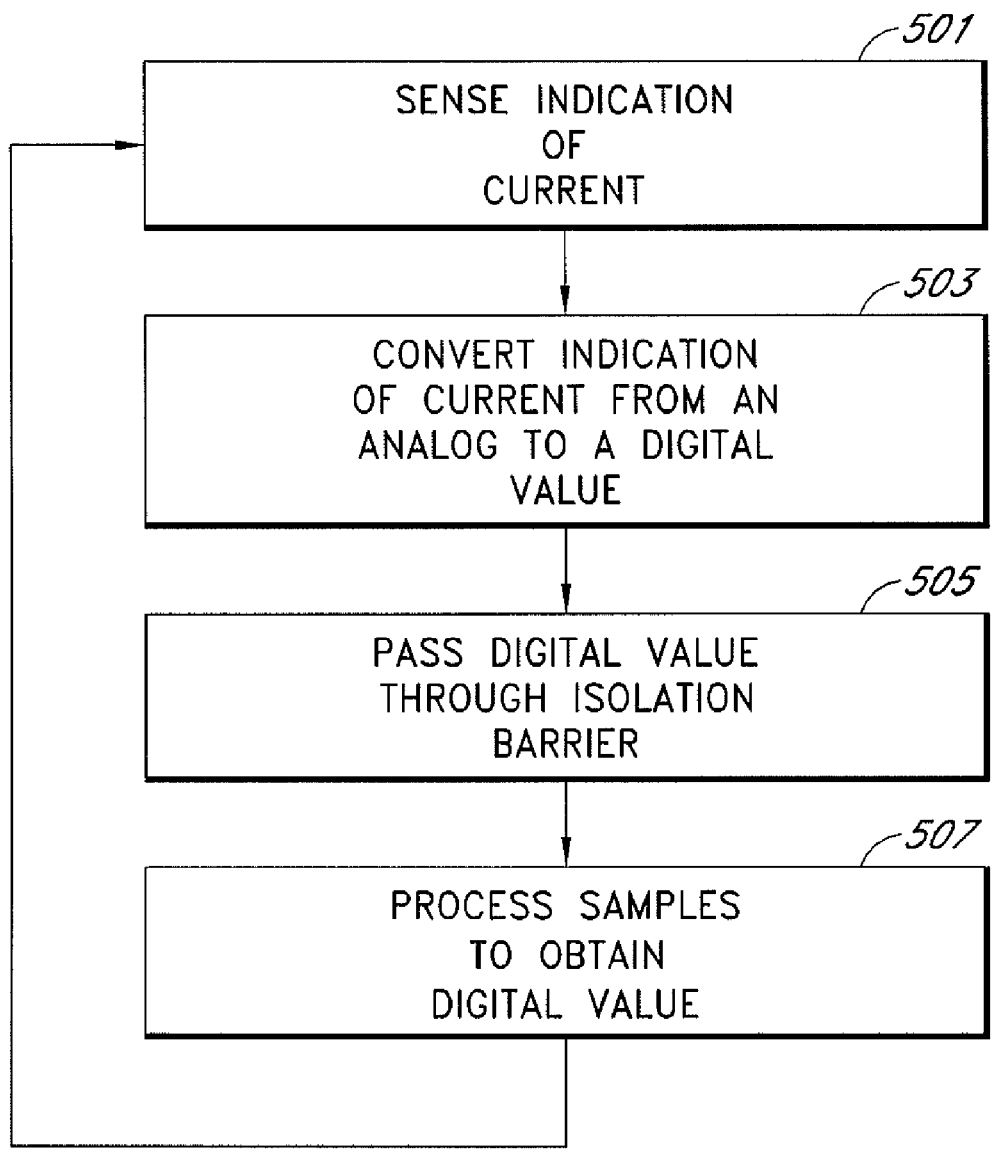
FIG. 5 is a flowchart illustrating the current measuring process.

FIG. 5 is a flowchart illustrating a process for measuring current. As power flows through a power line, an indication of the current is sensed at block 501. The sensed current indication is then converted from an analog to a digital value at block 503. The digital value is passed through an isolation barrier in block 505 as described above. Once the digital value passes through the isolation barrier, it is processed by the signal processor and/or decimation filter at block 507. The process then repeats itself. Parallel current sensing processes, such as described in relation to FIG. 5, can also be used for each additional phase. Similarly, a single multiplexed process can be used to measure current using an isolation barrier as described above.

Figure 6:
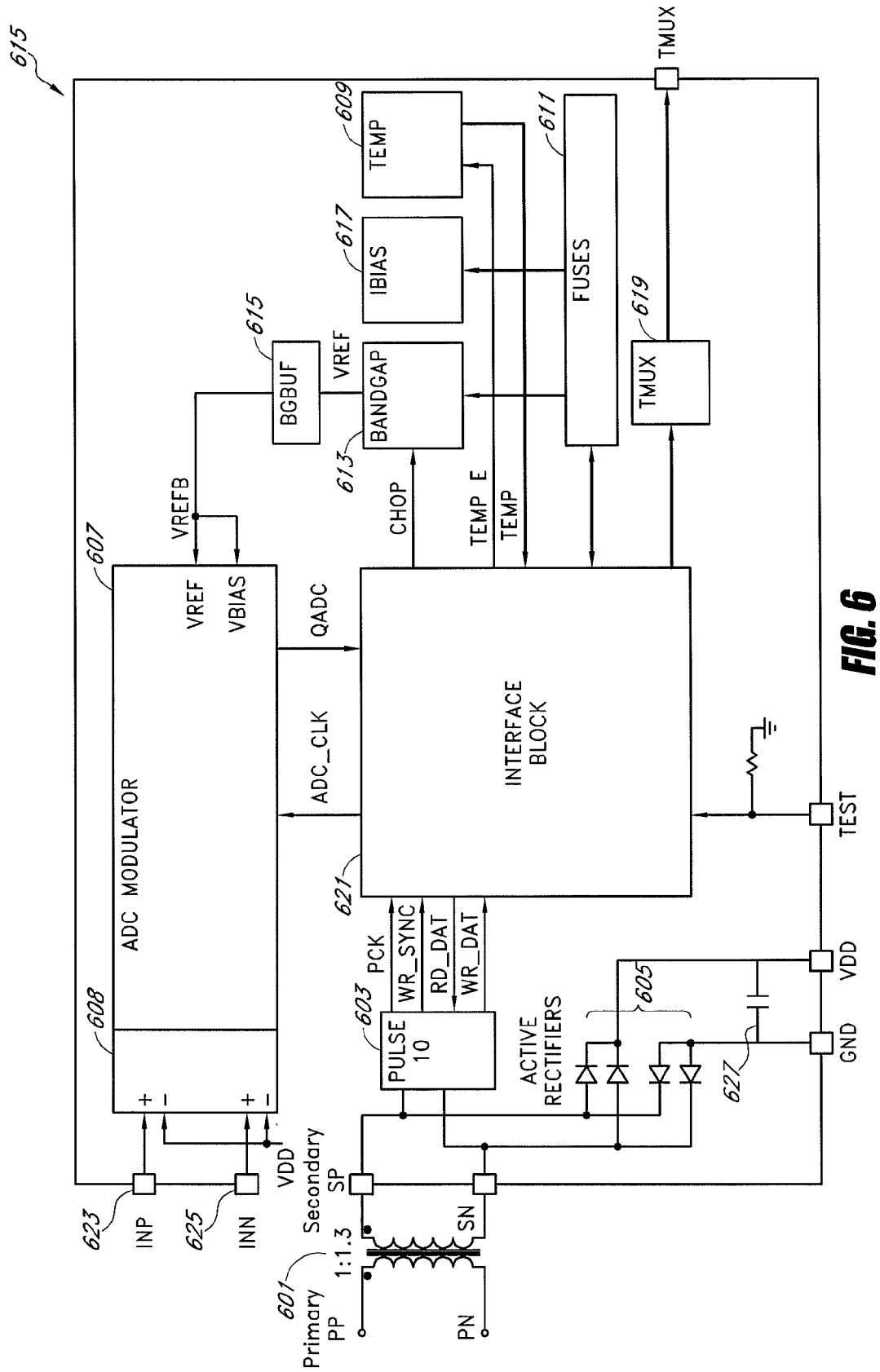
FIG. 6 illustrates an embodiment of a line side device.

FIG. 6 illustrates a block diagram of an embodiment of a line side device 600. Line side device 600 includes a pulse transformer 601, a pulse IO 603, active rectifiers 605, ADC modulator 607, amplification block 608, Temperature (TEMP) circuit 609, fuses 611, bandgap 613, bandgap buffer 615, Ibias 617, Test Multiplexer (TMUX) 619, and Interface block 621.

As described above, the line side device receives current indications from a current sensor and transmits digitized current indications to a host side device through a digital isolation barrier. Current indications are received at inputs 623, 625. The indications are amplified at amplification block 608 and are converted to digital values by ADC modulator 607. In one embodiment, the gain of amplification block 608 is about eight. The converted digital values are communicated to the Interface block 621 for buffering and formatting. The Interface block communicates the digital values to the Pulse IO 603 for transmission over the digital isolation barrier to the host side device.

Figure 7:
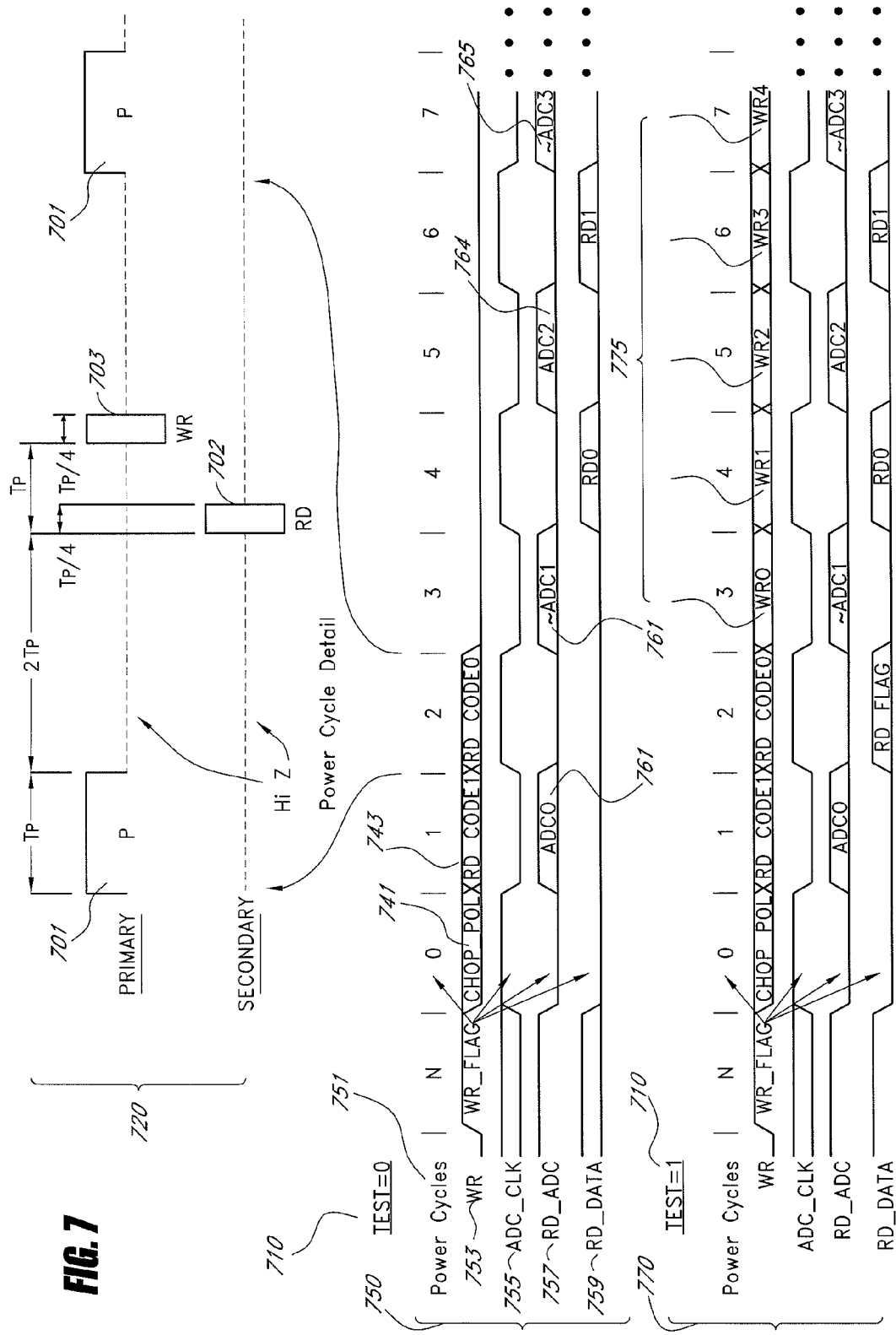
FIG. 7 is a timing chart illustrating line side and host side communications.

In one embodiment, operating power is received from the host side device through the isolation barrier 601 in the form of a power pulse as described in further detail with respect to FIG. 7. The power pulse is converted to operating power (VDD) through the active rectifiers 605. In one embodiment, the active rectifiers 605 provide a rectifying function with less than a drop of about 150 mv when momentary forward current is about 20 ma. In one embodiment, the host side device communicates control commands to the line side device through the isolation barrier 601. In one embodiment, the line side device communicates control, measurement and/or status information through the isolation barrier 601 to the host side device.

Still referring to FIG. 6, the TEMP circuit 609 performs a temperature measurement. In one embodiment, the temperature circuit 609 is used to determine the reference voltage and bias current communicated to the ADC modulator through bandgap 613, bandgap buffer 615, and Ibias 617. In one embodiment, the TEMP circuit 609 waits for an enable signal from the interface block 621. When it is received, it powers up, completes a temperature measurement and then powers down. In one embodiment, the TEMP circuit 609 only performs a temperature measurement when directed to do so by the host side device as communicated through the interface block 621. In one embodiment, the TEMP circuit 609 performs a 16 bit temperature measurement. In one embodiment, data from TEMP circuit 609 is buffered in the Interface block 621. This is done so that when a temperature output is requested by the host device, the Interface block 621 first outputs the buffered value, and then enables the TEMP circuit to create a new value. In one embodiment, the TEMP circuit is a VCO whose clock frequency is proportional to temperature. In one embodiment, the highest clock rate is 10 MHz. The VCO output is counted for P pulses. In one embodiment, P is 3800. The final value of the counter is the TEMP word.

In one embodiment, the fuses 611 provide a programmable memory. In one embodiment, 8 fuses are provided to store information about the line side device. The fuses 611 are programmed during manufacture, for example by blowing one or more of the fuses 611, so as to provide information about the line side device, such as, for example, voltage and current reference information, operating temperatures, manufacturing information or other information relevant to the line side device operation. In one embodiment, the information stored on the fuses are read by the digital block 621 and communicated over the digital isolation barrier 601 to the host side device.

In one embodiment, the line side device 600 includes a 6 pin test mode used to test the line side device. In one embodiment, the 6 pin test mode is asserted by pulling the INN input 625 to ground. In this mode, VDD and GND are powered directly and the INP input 623 becomes the TMUX 619 output. SP and SN continue to be the serial interface. SP and SN can also be raised above and below the power supplies to evaluate the active rectifier performance. In one embodiment, the current sensor 600 includes an 8 pin test mode. This test mode is entered by applying a voltage on a TEST pin input. In this mode, the INN and INP pins 625, 623 retain their normal function. In one embodiment, fuse trimming is performed in either the 6 or 8 pin test mode. In one embodiment, in one or all test modes, VDD and GND are powered externally to ensure sufficient current for reliable fuse writes. In one embodiment, when a fuse read request is received, the contents of the fuse buffer are outputted. In one embodiment, when the read is completed, the line side device 600 initiates an internal read sequence to refresh its fuse buffer. After the fuse buffer is refreshed, all fuse circuitry bias currents are turned off to save supply current.

In one embodiment, the current sensor 600 has a core power supply. In one embodiment, the current sensor 600 does not have a core power supply. In one embodiment, the circuitry operates from the VDD supply. In one embodiment, the VDD supply is 3.3 v. In one embodiment, a regulator for the VDD is not included so as to reduce the number of pins. In one embodiment, a local regulator is used with the bandgap 613, the bandgap buffer 615, and/or the preamplifier gain of the ADC modulator 607. This would have the effect of maximizing their DC and 60 Hz power supply rejection ratio (PSRR). In one embodiment, the turns ratio specification of the transformer is adjusted to keep VDD in a reasonable range as the power supply varies. For example, in one embodiment, the power supply varies from 3.0 v to 3.6 v. In one embodiment, the turn ratio is 1:1.3. In one embodiment, the power measurement device is accurate to about 1% of full scale. In one embodiment, the power measurement device is accurate to about 0.1% of full scale.

FIG. 7 is a timing diagram of a process of communication between a host and line side device over a pulse transformer. Diagram 750 illustrates an embodiment of a process when the test input 710 is low, or, in other words, when the line side device is not in test mode. At power cycle 751 N, a write flag (WR) 753 is received by the line side device. The WR flag 763 initiates the communication of write data. The write data includes chop polarity (CHOP POL) instruction 741 and a read code instruction (RD CODE) 743. In one embodiment, the WR flag reinitializes the ADC clock (ADC_CLK) 755, read ADC (RD_ADC) 757 and read data (RD_DATA) 759. In one embodiment, when the test input 711 is high, or, in other words, when the line side device is in a test mode, the write data includes additional TMUX and fuse settings 775 information in the write data string. In one embodiment, the CHOP POL instruction 741 synchronizes polarity inversion of the op-amp. Polarity inversion inverts every other ADC read code 761, 761, 763, 765 of RD_ADC 757 in order to avoid 60 Hz components in the communication of ADC information.

In one embodiment, output RD_DAT waveforms are immediate and not synchronized with the pulse clock.

In one embodiment, as illustrated by timing diagram 720, during each power cycle, an operating power pulse 701 is received by the line side device. In addition, during some power cycles, a read pulse or series of read pulses are transmitted by the line side device, and/or a write pulse or series of write pulses are received by the line side device. In between the power pulse and the read and write pulses, are periods of high impedance. The high impedance state allows the pulse transformer to fly back and discharge inductive currents induced by the pulses.

Although the foregoing invention has been described in terms of certain preferred embodiments, other embodiments will be apparent to those of ordinary skill in the art from the disclosure herein. For example, a skilled artisan will recognize from the disclosure herein that various methods of manufacture, design, and materials can be used to make the various components described herein. For example, instead of using a current shunt, a person of ordinary skill in the art would understand that other devices for measuring current could also be used, such as, for example, a current transformer, Rogowski coil or the like. Additionally, other combinations, omissions, substitutions and modifications will be apparent to the skilled artisan in view of the disclosure herein. It is contemplated that various aspects and features of the invention described can be practiced separately, combined together, or substituted for one another, and that a variety of combination and sub-combinations of the features and aspects can be made and still fall within the scope of the invention. Furthermore, the systems described above need not include all of the modules and functions described in the preferred embodiments. Accordingly, the present invention is not intended to be limited by the recitation of the preferred embodiments, but is to be defined by reference to the appended claims.

What is claimed is:

1. A current measurement system comprising:
a current sensing device, the current sensing device configured to generate a voltage proportional to a current flowing from a power source;
an analog-to-digital converter in communication with the current sensing device, the analog-to-digital converter configured to convert the voltage to digital data;
a processor configured to compute an indication of a power consumption based at least in part on the digital data; and
an isolation barrier configured to provide at least partial electrical isolation between the analog-to-digital converter and the processor, wherein operating power is supplied to the analog-to-digital converter through the isolation barrier and wherein the digital data is provided to the processor through the isolation barrier.

2. The current measurement system of claim 1, further comprising one or more barrier interface devices for communication through the isolation barrier.

3. The current measurement system of claim 2, wherein the barrier interface devices are configured to transmit information across the isolation barrier.

4. The current measurement system of claim 3, wherein the processor computes the power consumption using the information transmitted across the isolation barrier.

5. The current measurement system of claim 1, wherein the analog-to-digital converter comprises a modulator portion of a SIGMA-DELTA converter.

6. The current measurement system of claim 5, wherein the modulator portion of the SIGMA-DELTA converter comprises an analog SIGMA-DELTA modulator.

7. The current measurement system of claim 5, further comprising a digital filter configured to filter the digital data before the processor receives the digital data.

8. The current measurement system of claim 7, wherein the filter comprises a decimation filter.

9. The current measurement system of claim 1, further comprising two or more analog-to-digital converters and two or more isolation barriers configured to measure two or more phases of power across two or more current sensing devices.

10. The current measurement system of claim 1, wherein the isolation barrier comprises a pulse transformer.

11. The current measurement system of claim 1, wherein a clock signal is provided to the analog-to-digital converter through the isolation barrier.

12. The current measurement system of claim 1, wherein operational power is transmitted across the isolation barrier.

13. A power meter or circuit breaker or integrated protection device comprising:
an analog-to-digital converter configured to convert an indication of current flowing through a power source from analog values to digital values;
a decimation filter configured to decimate the digital values and to generate decimated values;
a processor configured to receive the decimated values and the indication of current and compute a power usage measurement; and
an isolation barrier configured to provide electrical isolation between signals sent from the analog-to-digital converter to the decimation filter.

14. The power meter of claim 13, wherein the isolation barrier comprises a pulse transformer.

15. The power meter of claim 13, further comprising a current shunt configured to provide the indication of current flowing through the power source to the analog-to-digital converter.

16. The power meter of claim 13, wherein the analog-to-digital converter and the decimation filter comprise a SIGMA-DELTA device.

17. The power meter of claim 13, wherein the isolation barrier comprises a pulse transformer.

18. The power meter of claim 13, wherein operational power is transmitted across the isolation barrier.

19. A method of measuring power comprising:
converting an indication of current flowing through a power source from an analog current signal to a digital current signal on a line side portion of a power measurement device;
communicating the digital signal from the line side portion through an electrical isolation barrier to a host-side portion of the power measurement device;
decimating the digital current signal;
determining an indication of a voltage across a power source; and
calculating a power consumption measurement.

20. The method of claim 19, wherein converting comprises over-sampling.

21. The method of claim 19, wherein communicating comprises inverting every other bit.

22. The method of claim 19, further comprising transmitting operating power over the isolation barrier from the host side to the line side.

23. A power meter, circuit breaker or integrated protection device comprising:
one or more analog-to-digital converters configured to convert an indication of current flowing through a multi-phase power source from analog values to digital values;
one or more decimation filters configured to decimate the digital values and to generated decimated values;
a processor configured to receive the decimated values and the indication of current and compute a power usage measurement; and
one or more isolation barriers configured to provide electrical isolation between signals sent from the analog-to-digital converter to the one or more decimation filters.

24. The power meter of claim 23, wherein the one or more isolation barriers comprise a pulse transformer.

25. The power meter of claim 23, further comprising one or more current shunts configured to provide the indication of current flowing through the power source to the analog-to-digital modulator.

26. The power meter of claim 23, wherein the one or more analog-to-digital converters and the one or more decimation filters comprise a SIGMA-DELTA device.

27. The power meter of claim 23, wherein the one or more isolation barriers comprise a pulse transformer.

28. The power meter of claim 23, wherein operational power is transmitted across one or more the isolation barriers.

29. A method of measuring power consumed in a multi-phase system comprising:
converting two or more indications of current flowing through a multi-phase power source from analog current signals to digital current signals on one or more line side portions of a power measurement device;

communicating the digital signals from the one or more line side portions through one or more electrical isolation barriers to one or more host-side portions of the power measurement device;

decimating the digital current signals;

determining indications of voltages across the multi-phase power source; and calculating a power consumption measurement.

30. The method of claim 29, wherein converting comprises over-sampling.

31. The method of claim 29, wherein communicating comprises inverting every other bit.

32. The method of claim 29, further comprising transmitting operating power over the one or more isolation barriers from the host side to the line side.

33. The current measurement system of claim 1, further configured to transmit data bidirectionally across the isolation barrier.

34. The power meter of claim 13, further configured to transmit data bidirectionally across the isolation barrier.

35. The method of claim 19, further comprising transmitting data bidirectionally across the isolation barrier.

36. The power meter of claim 23, further configured to transmit data bidirectionally across the one or more isolation barriers.

37. The method of claim 29, further comprising transmitting data bidirectionally across the one or more isolation barriers.

* * * * *

UNITED STATES PATENT AND TRADEMARK OFFICE
CERTIFICATE OF CORRECTION

| | |
|---|---|
| PATENT NO. | : 8,144,446 B2 |
| APPLICATION NO. | : 12/178547 |
| DATED | : March 27, 2012 |
| INVENTOR(S) | : Kourosh Boutorabi et al. |

It is certified that error appears in the above-identified patent and that said Letters Patent is hereby corrected as shown below:

| | |
|---|---|
| Column 2, Line 51 | Delete "a" and insert --an-- |
| Column 10, Line 35 | Delete "711" and insert --710-- |
| Column 10, Line 41 | Delete "763" and insert --764-- |
| Column 12, Line 61 | After "across", insert --the-- |
| Column 12, Line 61 | After "more", delete "the" |

Signed and Sealed this
Twenty-sixth Day of June, 2012

David J. Kappos
*Director of the United States Patent and Trademark Office*